INVENTOR.
EDMUND G. SHOWER
BY
John H. Gallagher
ATTORNEY

INVENTOR.
EDMUND G. SHOWER
BY
John H. Gallagher
ATTORNEY

United States Patent Office 3,239,719
Patented Mar. 8, 1966

3,239,719
PACKAGING AND CIRCUIT CONNECTION MEANS FOR MICROELECTRONIC CIRCUITRY

Edmund G. Shower, Westport, Conn., assignor to Sperry Rand Corporation, Great Neck, N.Y., a corporation of Delaware Filed July 8, 1963, Ser. No. 293,416
9 Claims. (Cl. 317—101)

This invention relates to circuit connecting means for establishing internal and external electrical connections to and between electrical circuits and individual components thereof which are formed as a part of, or are disposed on and conform to, a planar surface of a thin supporting member. The invention is particularly useful with microelectronic circuits and components wherein a plurality of semiconductor circuit elements are formed on and/or within a minute thin wafer of semiconductor material that constitutes the supporting member. The invention also is useful in what has become known as the module type of circuit packaging and arrangement in which circuit elements in the form of films or strips are disposed on thin planar supporting members which may be compactly stacked and appropriately interconnected to provide a desired electrical circuit.

In the types of circuit construction and packaging arrangements just mentioned, because of the very small size of such articles and the delicate and fragile nature of the supporting members, and because of the condensed packaging arrangements of these circuits, problems have existed in providing convenient and reliable internal and external electrical circuit connections that are compatible with efficient and compact assembling and packaging, and that are further compatible with thermal dissipation requirements. In addition to the above considerations, the means for establishing the necessary electrical connections must be susceptible to efficient and economical manufacturing techniques and procedures.

In present practices of manufacturing transistors and microelectronic circuitry, internal and external electrical connections often are made by means of fine wires that are secured to a surface of a semiconductor or other material by means of the well known thermo-compression bonding technique. These bonds and the very fine wires are quite fragile and often cannot withstand shock and vibration. These bonds definitely constitute the most troublesome feature in devices fabricated in this manner. Therefore, a fabrication technique that eliminates the thermo-compression bonding would significantly improve the quality of the devices under consideration.

It therefore is an object of this invention to provide improved electrical circuit connecting means for use with extremely small-sized electrical components and circuits.

Another object of this invention is to provide means and apparatus for establishing internal and external electrical connections to and between electrical components and elements disposed on closely packed thin planar supporting members.

A further object of this invention is to provide compact and reliable means for establishing circuit connections to semi-conductor devices formed as integral parts of minute wafers of semiconductor material.

Another object of this invention is to provide electrical connections to electrical elements in microelectronic and related circuitry by means that eliminates the need for thermo-compressive bonds.

The present invention will be described in reference to the accompanying drawings wherein.

Figure 1:
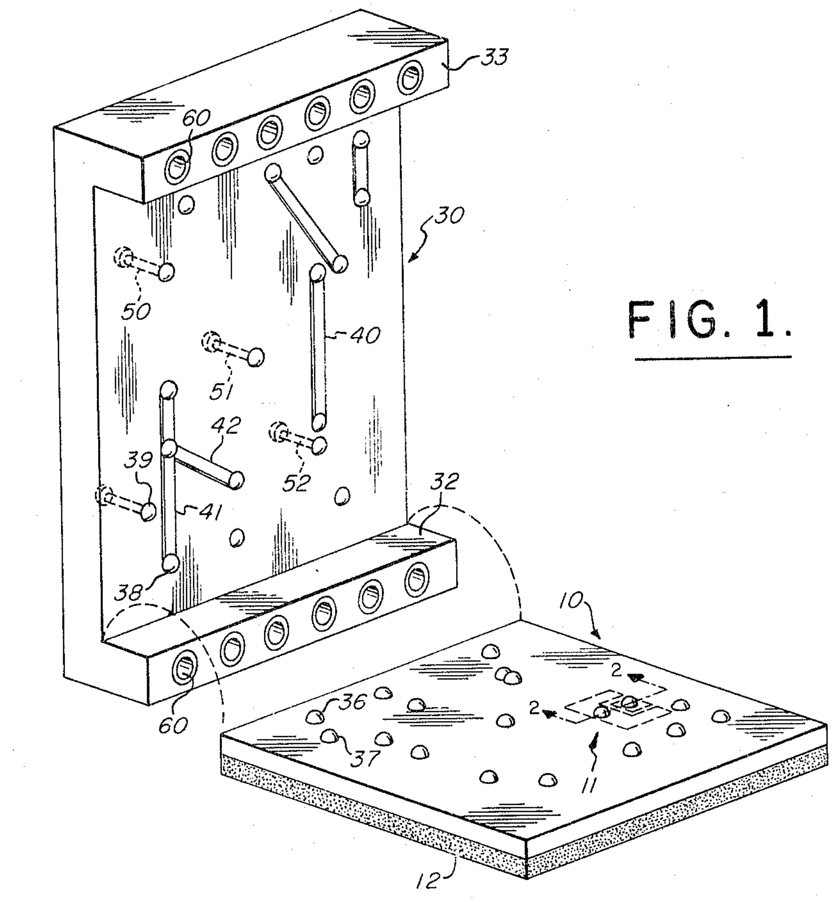
FIG. 1 is a perspective view showing a semiconductor wafer having a plurality of semiconductor devices formed therein and showing a printed circuit board, or backing member, adapted to engage said wafer and provide both circuit interconnection and external connections to said semiconductor devices.

Referring now in detail to the drawings, the embodiment of the invention illustrated in FIG. 1 is comprised of a thin wafer 10 of semiconductor material which typically may have dimensions .150 inch x .150 inch x .030 inch. Formed integrally in semiconductor wafer 10 are a plurality of semiconductor device circuit elements such as transistors, diodes, and resistors. The fabrication of electronic circuits and networks on a thin wafer of semiconductor material has become known by various names such as microelectronic circuitry, or integrated circuitry, for example. Such circuitry may be fabricated by any of a number of techniques such as those described in U.S. Patent 2,981,877, or techniques described in U.S. patent application S.N. 123,959, filed July 10, 1961 by Frank J. Hierholzer, and assigned to applicant's assignee. The method for forming the semiconductor devices in wafer 10 in accordance with the teachings of the Hierholzer application may be explained briefly as follows: The thin wafer of a semiconductor material of a predetermined conductivity type, such as P conductivity, is subjected to oxide masking and photo-resist techniques for controlling the diffusion of impurities into preselected areas of the semiconductor wafer. This diffusion of impurities into the wafer is in accordance with a pattern that establishes walls of N type conductivity that extend completely transversely between the plane surfaces of the wafer in such a manner as to partition the wafer into smaller portions of P type material. One entire face of the wafer then is converted to N type conductivity to a depth approximately equal to one-half the total thickness of the wafer. Next, preselected surface portions of the P conductivity regions are converted to areas of N conductivity type to form diffused junctions suitable for use as diode and resistor circuit elements. By successive diffusion steps, in the manner described, additional junctions may be formed so as to fabricate planar type transistors and other semi conductor devices.

Figures 2, 3:
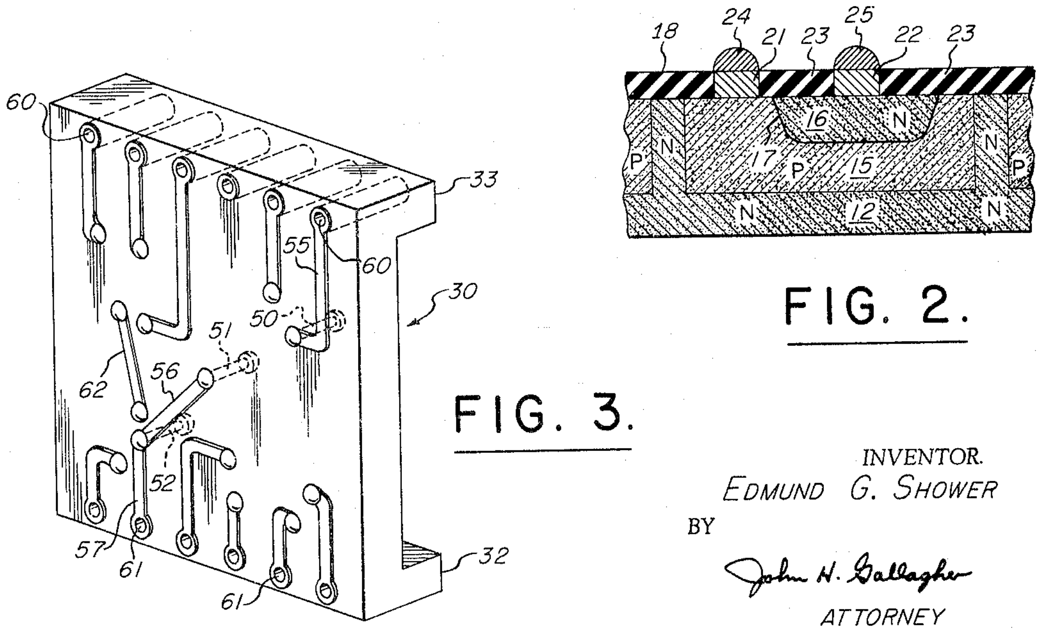
FIG. 2 is a partial cross-sectional view taken at the section 2—2 of the semiconductor wafer of FIG. 1.
FIG. 3 is a perspective top view of the printed circuit board of FIG. 1.

A semiconductor device formed on the wafer in the manner just described is illustrated in simplified form as the circuit element 11 in FIG. 1, and is shown in more detail in the cross-sectional view of FIG. 2 wherein the bottom portion 12 of wafer 10 is shown as N conductivity type material that forms an electrical insulating layer on the bottom of wafer 10. Within the section 15 of the original P type material is diffused the smaller area 16 of N conductivity type, whereby areas 15 and 16 are separated by a junction 17 so as to form a junction diode whose terminals are formed by the vacuum-deposited conductive contacts 21 and 22 on the top surface 18. An oxide coating 23 serves as an electrical insulation and junction protection on top surface 18. On the conductive contacts 21 and 22 are deposited dome-shaped ohmic contacts 24 and 25, respectively, both of which extend above the surface of the oxide coating 23. In FIG. 1, only the upwardly extending ohmic contacts are illustrated on the surface of semi conductor wafer 10.

The ohmic contacts may be applied by the use of a patterned mask or template to assure correct and uniformly repeatable applications.

Electrical connections are made to the dome-shaped ohmic contacts on the top surface of semiconductor wafer 10 by means of similar correspondingly positioned dome-shaped ohmic contacts on the bottom surface of a printed circuit board, or backing member, 30. As illustrated in FIG. 1, semiconductor wafer 10 is shown displaced from printed circuit board 30, but in its assembled position it is positioned closely adjacent and parallel to the bottom surface of printed circuit board 30 within the legs 32 and 33 so that the correspondingly positioned ohmic contacts of wafer 10 and circuit board 30 are in contact with each other. For example, ohmic contacts 36 and 37 of semi-conductor wafer 10 will be in registering contact with ohmic contacts 38 and 39 on the bottom surface of printed circuit board 30. All of the ohmic contacts are made of a relatively low temperature solder so that permanent and secure connections may be made between registering ohmic contacts by the application of heat and slight pressure.

Electrical interconnections between the ohmic contacts on semiconductor wafer 10, and thus between the various semi-conductor devices and elements in wafer 10 may be made by means of thin conductive strips such as 40, 41 and 42 on the bottom surface of printed circuit board 30. By the proper placement of the conductive strips between the ohmic contacts on the bottom surface of printed circuit board 30, the many different semiconductor devices in wafer 10 may be interconnected to form a desired circuit or network, or portions of larger circuits and networks.

External electrical connections may be made to the circuit or network formed by the interconnected devices in semiconductor wafer 10 by means of electrical connections established by conductively-coated holes or apertures such as 50, 51, and 52 which pass transversely through printed circuit board 30 and make contact with conductive strips that are printed on the top surface of printed circuit board 30. Each of the conductively coated holes 50, 51 and 52 that extend transversely through printed circuit board 30 also have dome-shaped ohmic contacts on the bottom surface so as to contact correspondingly positioned ohmic contacts on semiconductor wafer 10.

The top surface of printed circuit board 30 is illustrated in FIG. 3 which shows a number of conductive strips such as 55, 56 and 57 which extend outwardly toward the edge of printed circuit board 30 and make electrical contact with conductively coated holes such as 60, 61 that extend transversely through the legs 33 and 32, respectively, of printed circuit board 30. If necessary, certain network interconnections for the semiconductor devices on wafer 10 also may be established on the top surface of printed circuit board 30 as well as on the bottom surface as shown in FIG. 1. The conductive strip 62 is an example. This may be desirable in order to avoid the necessity for crossing over interconnecting conductive strips on the bottom surface of printed circuit board 30.

Figures 4, 5:
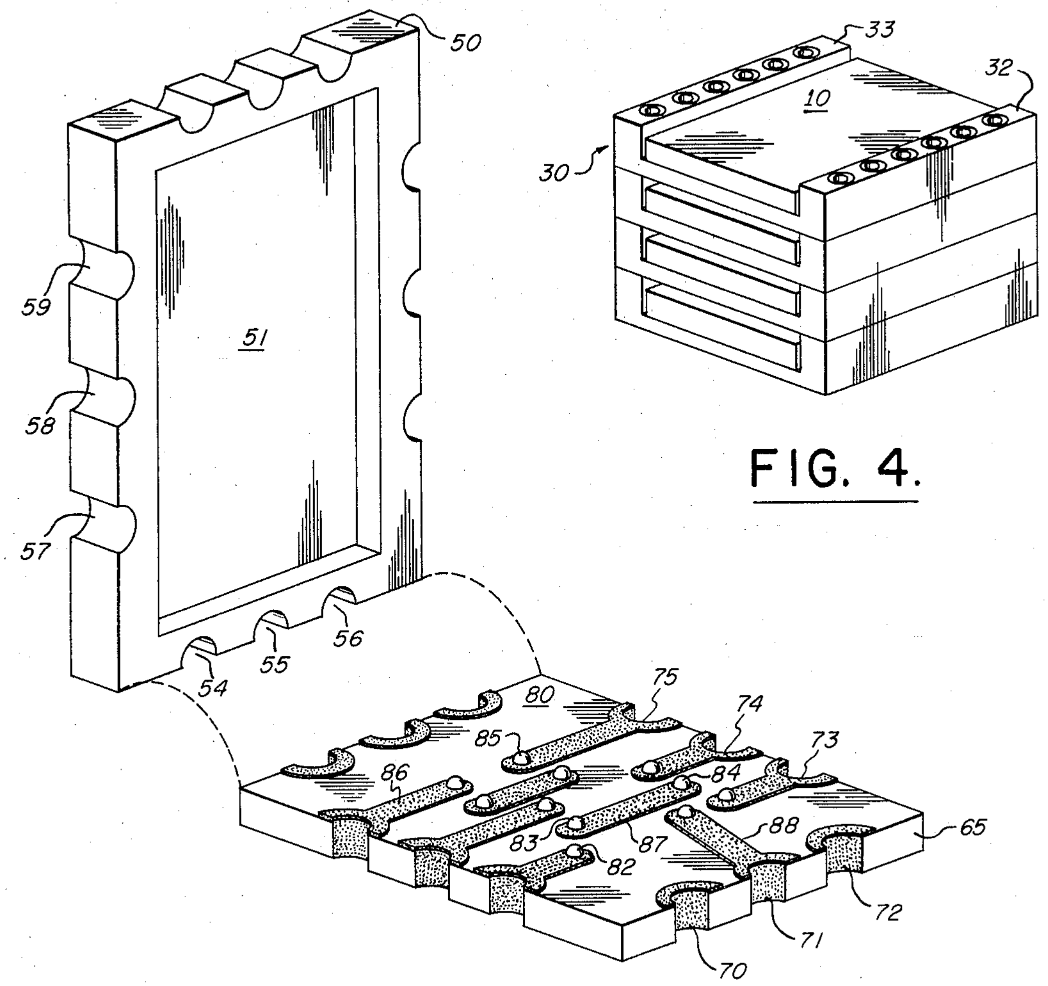
FIG. 4 is a perspective view of a number of assembled semiconductor wafers and circuit boards stacked together to form a completed product.
FIG. 5 is a perspective view showing the disassembled components of an alternative embodiment of this invention.

After semiconductor wafer 10 has been secured to printed circuit board 30 so as to establish the internal and external connections to the devices in wafer 10, a plurality of the assembled printed circuit boards and wafers may be stacked together in a manner illustrated in FIG. 4 wherein the interconnections between successive printed circuit boards are established by means of the conductively-coated holes in the legs 32 and 33 of the printed circuit board. Various means may be employed to establish the interconnections between the stacked circuit boards. For example, conductive wires may be extended through the aligned holes in the stacked circuit boards, or the conductively-coated holes may be secured and electrically connected together by means of drops of solder. If this latter technique is employed, the solder should have a lower melting point than that used for the ohmic contacts on semiconductor wafer 10 and on the bottom surface of the printed circuit board 30 in order to permit the stacking and possible replacement of printed circuit boards within a stack without adversely affecting the secured ohmic contacts between the wafers and printed circuit boards.

As illustrated in FIG. 4, the height of the legs of each of the circuit boards, such as the legs 32 and 33 illustrated in FIG. 1, is greater than the thickness of a semiconductor wafer so that slight void spaces are left between the layers of the stacked circuit boards. This permits the circulation of a cooling air stream or other fluid through the stacked circuit boards to help maintain the semiconductor wafers below a certain temperature limit.

From the above description it may be seen that the electrical circuits and networks are formed in small rugged packages that provide reliable circuit interconnections and external connections, and it is further seen that the troublesome thermo-compression bonds have been eliminated.

An alternative embodiment of the present invention that lends itself to the hermetic sealing of the microelectronic circuitry and networks is illustrated in FIG. 5. Base member 50 of a ceramic or other suitable insulating material is provided with a centrally located recess or cavity portion 51 and a plurality of notches 54–49, etc. are disposed about the periphery and are arranged uniformly with three on each side. A semiconductor wafer, such as the wafer 63 of FIG. 6 which may be identical to wafer 10 of FIG. 1, is positioned within the recess 51 and is secured to a thin metallic plate 64 which in turn is secured to the bottom surface of recess 51. Metallic plate 64 serves as a heat conductor to conduct heat from the semiconductor wafer 63 to the base member 50. A cover plate 65 having substantially the same planar dimensions as base member 50 also is provided with a plurality of notches 70–75, etc. about its periphery and these notches are located so as to register with the notches 56–59, etc. in base member 50 when cover plate 65 is positioned on top of base member 50.

Figure 6:
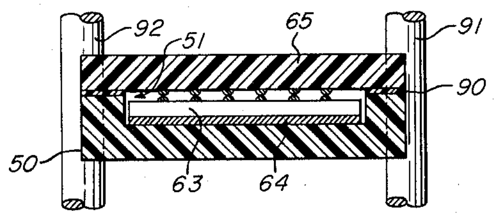
FIG. 6 is a sectional view of the assembled embodiment of the invention illustrated in FIG. 5.

On the bottom surface 80 of cover plate 65 are located a number of dome-shaped ohmic contacts 82–85, as examples, and a plurality of strips of conductive material 86, 87, and 88, for example. The ohmic contacts such as 82–85 on the bottom surface of cover plate 65 are positioned to register with and make conductive contact with corresponding ohmic contacts on semiconductor wafer 63, when the base and cover plate are assembled, as illustrated in FIG. 6. The dome-shaped ohmic contacts on cover plate 65 and on semiconductor wafer 63 are made of a low temperature solder material and the registering ohmic contacts on wafer 63 and cover plate 65 are secured together by the application of heat and slight pressure. Some of the conductive strips 86, 87 and 88, etc. on the bottom of cover plate 65 make conductive connections between various ones of the ohmic contacts to establish circuit interconnections between semiconductor devices and elements formed in wafer 63, and other conductive strips make conductive contact with designated ones of the notches 70–79 which are coated with a conductive material which is illustrated by the stippled areas in FIG. 5.

Base member 50 and cover plate 65 are positioned together in registration and are secured together by means of an adhesive plastic or a glass or ceramic frit 90, FIG. 6, to hermetically seal therewithin the semiconductor wafer 63. A plurality of the sealed assemblies illustrated in FIG. 6 then may be stacked together and held rigid by suitable means such as riser wires 91, 92 which are secured to the metallized notches 70, 71, 72, etc. by soldering of spot welding, thus holding a number of base member and cover plate assemblages in rigid relationship to form a complete module of the desired number of assemblages.

In regard to the cover plate 65 of FIG. 5, it is not necessary that all of the conductive strips 86, 87, 88, etc. that provide the circuit interconnections and the external connections be contained on the bottom surface 80 of the cover plate. If desired, some of these connections may be made on the top surface of cover plate 65 in the same manner as illustrated in FIG. 3. Should this approach be pursued, electrical connections to the top of cover plate 65 would be provided by means of solder-filled holes or apertures that extend transversely through cover plate 65. Also, the cover plate 30 of FIG. 1 may be made in the manner illustrated in FIG. 5 wherein both the circuit interconnections and the external connections are provided exclusively on the bottom surface of printed circuit board 30.

Although the teachings of the present invention are particularly useful with the microelectronic circuitry comprised of semiconductor devices and elements formed as an integral part of a semiconductor wafer, the teachings of this invention also are useful with other "module" types of circuit construction and packaging. For example, the supporting members comprising semiconductor wafers 10 of FIG. 1 and 63 of FIG. 6 may be replaced by thin dielectric supporting members upon which has been deposited conductive or semiconductive members upon which has been deposited conductive or semiconductive material in such a fashion as to form resistors, capacitors, inductors, or other circuit elements. Alternatively, the semiconductor wafers may be replaced by a plurality of chips of semiconductor material, each chip containing a circuit component, each of which is fastened to a common substrate and subsequently treated as the wafers 10 and 63.

It may be seen that the teachings of this invention are well suited for large volume production of different types of circuits and networks since identical semiconductor wafers each having formed therein a plurality of transistors, diodes, resistors, and other circuit elements may be readily joined to printed circuit boards having the various desired interconnections and external connections printed thereon. Many different standard masks for forming the desired printed circuits on the circuit boards may be maintained in stock, and the production process and sequence for producing the different circuits and networks need not vary or change except for the substitution of different printed circuit masks during the step of forming the printed circuitry on the boards.

Because the semiconductor wafers are secured to the printed circuit board by solder connections, and since the circuit boards are secured in stacks by means of solder connections, the replacement of any individual wafer or printed circuit board is not a difficult task, and if desired, it is not necessary that the entire stack be discarded should trouble occur with any individual semiconductor wafer or circuit board. These advantages obviously would not exist if individual lead wires were employed and if connections were made to the semiconductor devices by means of thermo-compression bonding techniques.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. Means for packaging electronic circuit elements and for providing circuit interconnections and external connectors as a part of said packaging means, said means comprising, a planar supporting member, at least one electrical circuit element formed on said supporting member, dome-shaped circuit element contacts in conductive contact with said circuit element and extending above a surface of the supporting member, a planar circuit board disposed in closely adjacent parallel relationship to said surface of the supporting member and extending transversely beyond the bounds of said supporting member, a plurality of dome-shaped conductive contact elements disposed on and extending above the surface of said circuit board that is adjacent said supporting member, at least some of said contact elements on said circuit board being positioned in registering contact with said circuit element contacts on said supporting member, a plurality of connecting terminals extending transversely through said circuit board in a region beyond the bounds of said supporting member and accessible for making direct electrical connections thereto from both sides of said circuit board, and conductive strips disposed on said circuit board for providing electrical connections between various ones of said contact elements and designated ones of said connecting terminals.

2. The combination claimed in claim 1 wherein the portion of said circuit board that extends beyond the bounds of said supporting member is of increased thickness to extend above said supporting member.

3. The combination claimed in claim 1 and further including, a recessed base member adapted to receive said supporting member therein and adapted to make a firm contact with said circuit board, said base member and said circuit board being made of a material impervious to air, and means forming a hermetic seal between said base member and the region of said circuit board beyond the bounds of said supporting member.

4. The combination claimed in claim 3 and further including, heat conducting means securing said supporting member to said base member to provide a heat conducting path therebetween.

5. Means for packaging a microelectronic circuit and for providing circuit interconnections and external connectors as a part of said packaging means, said means comprising, a thin wafer of semiconductor material, a plurality of semiconductor devices formed as a part of said wafer, a plurality of ohmic contacts disposed on a common face of said wafer and extending above said face to provide electrical connectors for said devices, a backing member disposed in closely adjacent parallel relationship to said wafer and extending transversely beyond the bounds of said wafer, a plurality of conductive contact members disposed on and extending above the surface of said backing member adjacent said wafer, at least some of said contact members on said backing member being positioned in registering contact with ohmic contacts on said wafer, a plurality of connecting terminals extending transversely through said backing member in the region beyond the bounds of said wafer and accessible for making direct electrical connections thereto from both sides of said backing member, conductive strips disposed on said backing member and extending between various ones of said contact members and between designated ones of said contact members and said connecting terminals, whereby said conductive strips provide circuit interconnections between various ones of said devices and also provide means for connecting said devices to external electrical means that are connected to said connecting terminals.

6. The combination claimed in claim 5 wherein said backing member includes two planar surfaces and said conductive strips are disposed on both of said planar surfaces, said combination further including, conductive means extending transversely through said backing member between said planar surfaces to provide electrical connections between conductive contact members on one of said surfaces and conductive strips on the other planar surface.

7. Means for packaging a microelectronic circuit and for providing circuit interconnections and external connectors as a part of said packaging means, said means comprising, a thin wafer of semiconductor material, a plurality of electrical circuit elements formed integrally as a part of said wafer, a plurality of dome-shaped ohmic contacts disposed on said circuit elements and extending above the surface of said wafer to provide electrical connections for said circuit elements, a planar circuit board disposed in closely adjacent parallel relationship to said wafer and extending transversely beyond the bounds of said wafer, a second plurality of dome-shaped ohmic contacts disposed on and extending above the surface of said circuit board adjacent said wafer, at least some of the ohmic contacts on said circuit board being in registering contact with ohmic contacts on said wafer, a plurality of connecting terminals extending transversely through said circuit board in the region beyond the bounds of said wafer and being accessible for making direct electrical connections thereto from both sides of said circuit board, conductive strips disposed on said circuit board and extending between given ohmic contacts thereon and between designated ones of said ohmic contacts and said connecting terminals, whereby said conductive strips provide circuit interconnections between various ones of said circuit elements and also provide means for connecting said circuit elements to external electrical means that are connected to said terminals, said terminals being located in a given arrangement to facilitate the stacking on both sides of said circuit board of additional circuit board and wafer assemblies having similarly located terminals.

8. The combination claimed in claim 7 and further including a recessed base member adapted to receive said wafer therein and adapted to form a contacting joint with said circuit board, said base member and said circuit board being made of a material impervious to air, and means forming a hermetic seal between said base member and the region of said circuit board beyond the bounds of said wafer.

9. The combination claimed in claim 8 and further including, heat conducting means securing said wafer to said base member to provide a heat conducting path therebetween.

References Cited by the Examiner

UNITED STATES PATENTS

| | | | |
|---|---|---|---|
| 2,782,389 | 2/1957 | Sunko et al. | 339—17 |
| 2,971,138 | 2/1961 | Meisel et al. | 317—101 X |

OTHER REFERENCES

Electronic Design, "Stacked, Sealed Wafer Stages Used in Sylvania Microcircuits," June 22, 1960, pages 28 and 29.

KATHLEEN H. CLAFFY, *Primary Examiner.*

JOHN F. BURNS, *Examiner.*